United States Patent [19]
Kersh, III

[11] Patent Number: 5,208,557
[45] Date of Patent: May 4, 1993

[54] MULTIPLE FREQUENCY RING OSCILLATOR

[75] Inventor: David V. Kersh, III, Sugarland, Tex.

[73] Assignee: Texas Instruments Incorporated, Dallas, Tex.

[21] Appl. No.: 837,521

[22] Filed: Feb. 18, 1992

[51] Int. Cl.⁵ .................... H03B 5/24; H03K 3/354
[52] U.S. Cl. .................... 331/57; 307/296.2; 331/74; 331/179
[58] Field of Search .................... 331/57, 74, 179; 307/296.2

[56] References Cited

U.S. PATENT DOCUMENTS

| | | | |
|---|---|---|---|
| 3,931,588 | 1/1976 | Gehweiler | 331/57 |
| 4,585,954 | 4/1986 | Hashimoto et al. | 307/296 R |
| 4,631,421 | 12/1986 | Inoue et al. | 307/297 |
| 4,656,369 | 4/1987 | Lou | 307/297 |

OTHER PUBLICATIONS

IBM Technical Disclosure Bulletin, vol. 32 No. 4A Sep. 1989, pp. 410–411 "Frequency Modulated Ring Oscillator For A Mode Regulated Substrate Bias Generator".

Primary Examiner—Siegfried H. Grimm
Attorney, Agent, or Firm—W. James Brady, III; B. Peter Barndt; Richard L. Donaldson

[57] ABSTRACT

A multiple frequency oscillator responds to a control signal to selectively produce an output signal having a first frequency or a second frequency. The oscillator includes a plurality of inverter stages ($48_1$–$48_5$) with the input of each inverter stage coupled to the output of another inverter stage. At least one of the inverter stages includes first and second transistors (50,51) having current paths connected in parallel, a third transistor (52) having a current path connected in series with the current paths of the first and second transistors (50, 51) between a first voltage source (Vdd) and the inverter stage output, and a fourth transistor (53) having a current path connected between the inverter stage output and a second voltage source (Vss). The control electrodes of the first, third, and fourth transistors (50, 52, 53) are connected to the input of the inverter stage. A control signal controls the conductivity of the second transistor (51) to select the frequency of output signal of the oscillator (44).

34 Claims, 5 Drawing Sheets

MULTIPLE FREQUENCY RING OSCILLATOR

FIELD OF THE INVENTION

This invention generally relates to oscillators and, more particularly, to multiple frequency oscillators.

BACKGROUND OF THE INVENTION

Without limiting the scope of the invention, its background is described in connection with substrate bias voltage generators for dynamic random access memories (DRAMs) and other semiconductor devices, as an example.

DRAMs, as well as other types of semiconductor devices, are often provided with both an active mode and a standby mode of operation. Power consumption in the standby mode is reduced with respect to that in the active mode to increase efficiency during periods of time in which the device is powered up but idle.

One method to reduce power consumption in the standby mode is to reduce the frequency of operation of various circuits, such as substrate bias voltage generators, that must continually operate while the device is powered up. This method requires dual oscillator frequencies: a higher frequency to drive the circuits at full speed during operation in the active mode, and a lower frequency to drive the circuits at a slower speed, thereby reducing the power consumed by the circuits, during operation in the standby mode.

Figure 1:
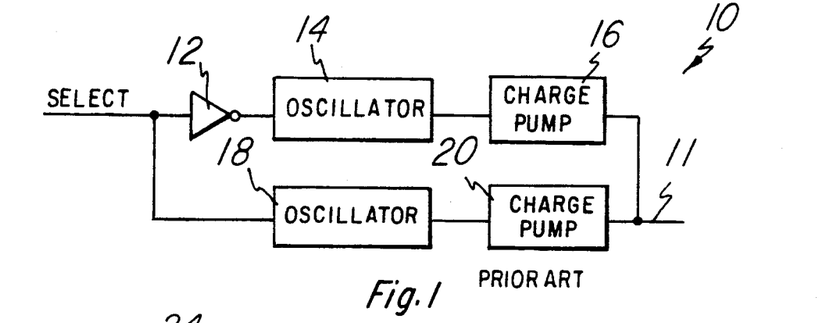
FIGS. 1-3 are schematic block diagrams of substrate bias voltage generators according to the prior art.

FIG. 1 shows a substrate bias voltage generator 10 according to the prior art that operates at dual frequencies. As is well known, substrate bias voltage generators are used to bias the substrates of DRAMs and other semiconductor devices to a negative voltage in order to improve performance of the semiconductor device. Substrate bias voltage generator 10 includes a first oscillator 14 and a first charge pump 16 for biasing substrate node 11 when the semiconductor device is operating in the active mode. Substrate bias voltage generator 10 also includes a second oscillator 18 and a second charge pump 20 for biasing substrate node 11 when the semiconductor device is operating in the standby mode.

Oscillator 18 has an input for receiving a SELECT signal while oscillator 14 has an input for receiving an inverted SELECT signal via inverter 12. In the standby mode, the SELECT signal has a high state to activate oscillator 18 and inactivate oscillator 14. Oscillator 18, when activated, supplies an output signal having a first frequency f1 to charge pump 20. Charge pump 20 biases substrate node 11 in response to the output signal from oscillator 18.

In the active mode, the SELECT signal has a low state to inactivate oscillator 18 and activate oscillator 14. Oscillator 14, when activated, supplies an output signal having a second frequency f2, that is greater than f1, to charge pump 16. Charge pump 16 biases substrate node 11 in response to the output signal from oscillator 14.

While substrate bias voltage generator 10 is capable of operating at dual frequencies to reduce standby power consumption, the cost is a relatively large amount of silicon area since two separate oscillators and two separate charge pumps are required.

Figure 2:
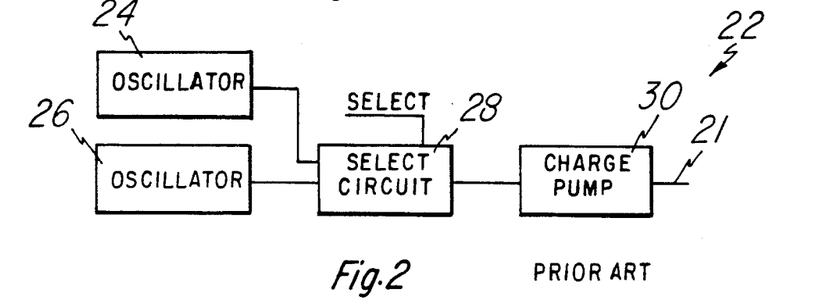

FIG. 2 shows a second substrate bias voltage generator 22 according to the prior art that operates at dual frequencies. Substrate bias voltage generator 22 includes a first oscillator 24 that supplies an output signal having a first frequency f1 to select circuit 28 and a second oscillator 26 that supplies an output signal having a second frequency f2, that is greater than f1, to select circuit 28. Select circuit 28 selectively couples the output signal of oscillator 24 or the output signal of oscillator 26 to charge pump 30 in response to a SELECT signal. Charge pump 30 generate a bias voltage in response to the signal received from select circuit 28.

In the standby mode, the SELECT signal has a first state causing select circuit 28 to couple the output of oscillator 24 to charge pump 30. Charge pump 30 biases substrate node 21 in response to the output signal from oscillator 24.

In the active mode, the SELECT signal has a second state causing select circuit 28 to couple the output of oscillator 26 to charge pump 30. Charge pump 30 biases substrate node 21 in response to the output signal from oscillator 26.

While substrate bias voltage generator 22 is capable of operating at dual frequencies to reduce standby power consumption, the cost is a relatively large amount of silicon area since two separate oscillators and a select circuit are required.

Figure 3:
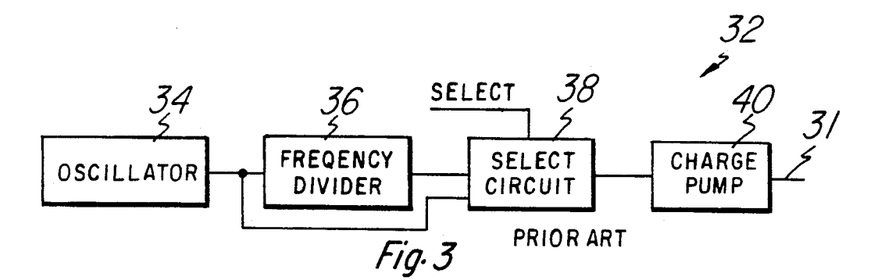

FIG. 3 shows a third substrate bias voltage generator 32 according to the prior art that operates at dual frequencies. Substrate bias voltage generator 32 includes an oscillator 34 that supplies an output signal having a first frequency f2 to select circuit 38 and to frequency divider 36. Frequency divider 36 supplies an output signal having a second frequency f1, that is less than f2, to select circuit 38. Select circuit 38 selectively couples the output signal of oscillator 34 or the output signal of frequency divider 36 to charge pump 40 in response to a SELECT signal. Charge pump 40 generate a bias voltage in response to the signal received from select circuit 38.

In the standby mode, the SELECT signal has a first state causing select circuit 38 to couple the output of frequency divider 36 to charge pump 40. Charge pump 40 biases substrate node 31 in response to the output signal from frequency divider 36.

In the active mode, the SELECT signal has a second state causing select circuit 38 to couple the output of oscillator 34 to charge pump 40. Charge pump 40 biases substrate node 31 in response to the output signal from oscillator 34.

While substrate bias voltage generator 32 is capable of operating at dual frequencies to reduce standby power consumption, the cost is a relatively large amount of silicon area since a frequency divider and select circuit are required. In addition, the reduction in power consumption is compromised to some extent by the power required to operate frequency divider 36.

SUMMARY OF THE INVENTION

Generally, and in one form of the invention, a multiple frequency oscillator, includes: a plurality of inverter stages, each inverter stage including an input and an output, the input of each inverter stage coupled to the output of at least one other inverter stage, one of the inverter stage outputs supplying an oscillator output signal; at least one of the inverter stages having an input for receiving a control signal, the control signal selectively having a first state or a second state, the at least one inverter stage responsive to the first state to cause the oscillator output signal to have a first frequency and responsive to the second state to cause the oscillator output signal to have a second frequency different from the first frequency.

An advantage of the invention is a reduction in the area required by a circuit capable of producing an output signal having a plurality of selectable frequencies.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 4:
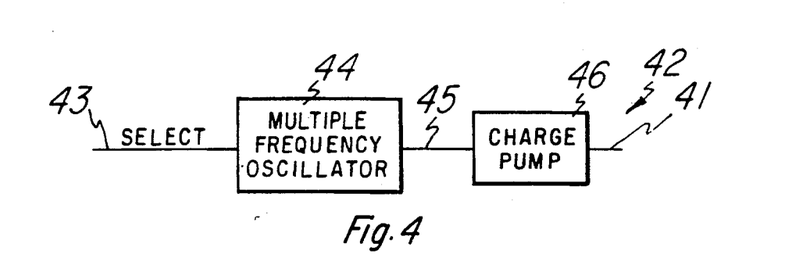
FIG. 4 is a schematic block diagram of a substrate bias voltage generator according to the invention.

FIG. 4 shows a substrate bias voltage generator 42 according to the invention that operates at multiple frequencies. Substrate bias voltage generator 42 includes a dual frequency oscillator 44 connected to a charge pump 46. Dual frequency oscillator 44 receives a SELECT signal on line 43 and in response supplies an oscillating output signal having a predetermined frequency over line 45 to charge pump 46. The output signal of oscillator 44 has a first frequency f1 when the SELECT signal is low and a second frequency f2, which is greater than f1, when the SELECT signal is high.

Charge pump 46 generates a bias voltage to bias substrate node 41 in response to the signal received from oscillator 44. In the standby mode, the SELECT signal has a first low state to cause oscillator 44 to produce an oscillating output signal having low frequency f1. Charge pump 46 biases substrate node 41 in response to the output signal from oscillator 44 having frequency f1.

In the active mode, the SELECT signal has a second high state to cause oscillator 44 to produce an oscillating output signal having high frequency f2. Charge pump 46 biases substrate node 41 in response to the output signal from oscillator 44 having frequency f2.

Charge pump 46 may be implemented using any of numerous well-known circuits. Suitable charge pump circuits are disclosed in U.S. Pat. Nos. 4,631,421 and 4,628,215, both of which are assigned to Texas Instruments, Incorporated and are incorporated herein by reference.

Figure 5:
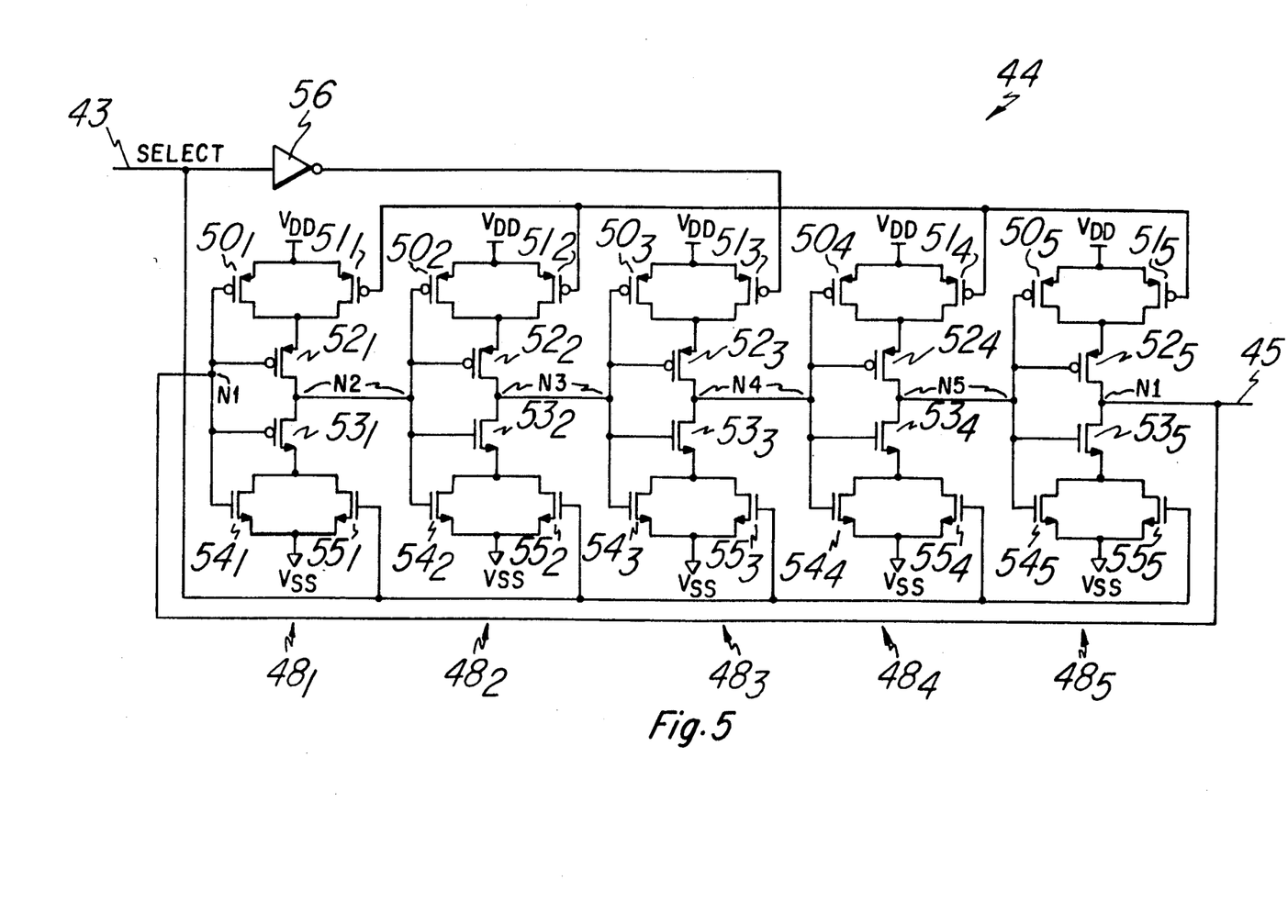
FIG. 5 is a schematic diagram of the dual frequency oscillator of FIG. 4.

FIG. 5 shows oscillator 44 in detail. Oscillator 44 is a ring oscillator having an odd number (in this case, five) of cascaded inverter stages $48_1$–$48_5$. The outputs of inverter stages $48_1$, $48_2$, $48_3$, $48_4$, and $48_5$ are connected to the inputs of stages $48_2$, $48_3$, $48_4$, $48_5$, and $48_1$, respectively.

Each inverter stage 48 includes parallel-coupled p-channel transistors 50 and 51 having drains connected to a source of positive voltage Vdd and sources connected to the drain of p-channel transistor 52. Each inverter stage 48 also includes parallel coupled n-channel transistors 54 and 55 having sources connected to Vss or ground and drains connected to the source of n-channel transistor 53. The input of each inverter stage 48 is connected to the gates of transistors 50, 52, 53, and 54. The output of each inverter stage 48 is connected between the source of transistor 52 and the drain of transistor 53.

The SELECT signal on line 43 is applied to the gates of n-channel transistors $55_1$–$55_5$ and to the input of inverter 56. Inverter 56 applies an inverted SELECT signal to the gates of p-channel transistors $51_1$–$51_5$.

The frequency of oscillation of the output signal produced by oscillator 44 is determined by the rates at which nodes N1–N5 charge and discharge. The rate at which each of nodes N1–N5 charges is directly proportional to the capacitance at that node and the rate at which current flows to that node. The rate at which each of nodes N1–N5 discharges is directly proportional to the capacitance at that node and the rate at which current flows from that node. The state of the SELECT signal controls whether transistors $51_1$–$51_5$ and $55_1$–$55_5$ are conducting or non-conducting to determine the rate at which current flows to or from nodes N1–N5 and thereby the frequency of the output signal produced by oscillator 44 on line 45.

When the SELECT signal is in a low state, oscillator 44 produces an output signal having low frequency f1. This is due to the fact that the low state of the SELECT signal applied to the gates of n-channel transistors $55_1$–$55_5$ turns transistors $55_1$–$55_5$ off, while the high state of the inverted SELECT signal applied to the gates of p-channel transistors $51_1$–$51_5$ also turns transistors $51_1$–$51_5$ off. The nodes N1–N5 are alternately charged by current flowing through series connected transistor pairs $50_1$ and $52_1$; $50_2$ and $52_2$; $50_3$ and $52_3$; $50_4$ and $52_4$; $50_5$ and $52_5$, respectively, and discharged by current flowing through series connected transistor pairs $53_1$ and $54_1$; $53_2$ and $54_2$; $53_3$ and $54_3$; $53_4$ and $54_4$; $53_5$ and $54_5$, respectively.

When the SELECT signal is in a high state, oscillator 44 produces an output signal having high frequency f2. This is due to the fact that the high state of the SELECT signal applied to the gates of n-channel transistors $55_1$–$55_5$ turns transistors $55_1$–$55_5$ on, while the low state of the inverted SELECT signal applied to the gates of p-channel transistors $51_1$–$51_5$ also turns transistors $51_1$–$51_5$ on. The nodes N1–N5 are alternately charged by current flowing through groups of transistors $50_1$, $51_1$ and $52_1$; $50_2$, $51_2$ and $52_2$; $50_3$, $51_3$ and $52_3$; $50_4$, $51_4$ and $52_4$; and $50_5$, $51_5$ and $52_5$, respectively, and discharged by current flowing through series connected transistor pairs $53_1$, $54_1$ and $55_1$; $53_2$, $54_2$ and $55_2$; $53_3$, $54_3$ and $55_3$; $53_4$, $54_4$ and $55_4$; and $53_5$, $54_5$ and $55_5$, respectively. With transistors $51_1$–$51_5$ and $55_1$–$55_5$ on, the rate at which current flows to or from nodes N1–N5 is increased to increase the rate at which nodes N1–N5 charge and discharge and therefore the frequency of the output signal produced by oscillator 44.

Figure 6A:
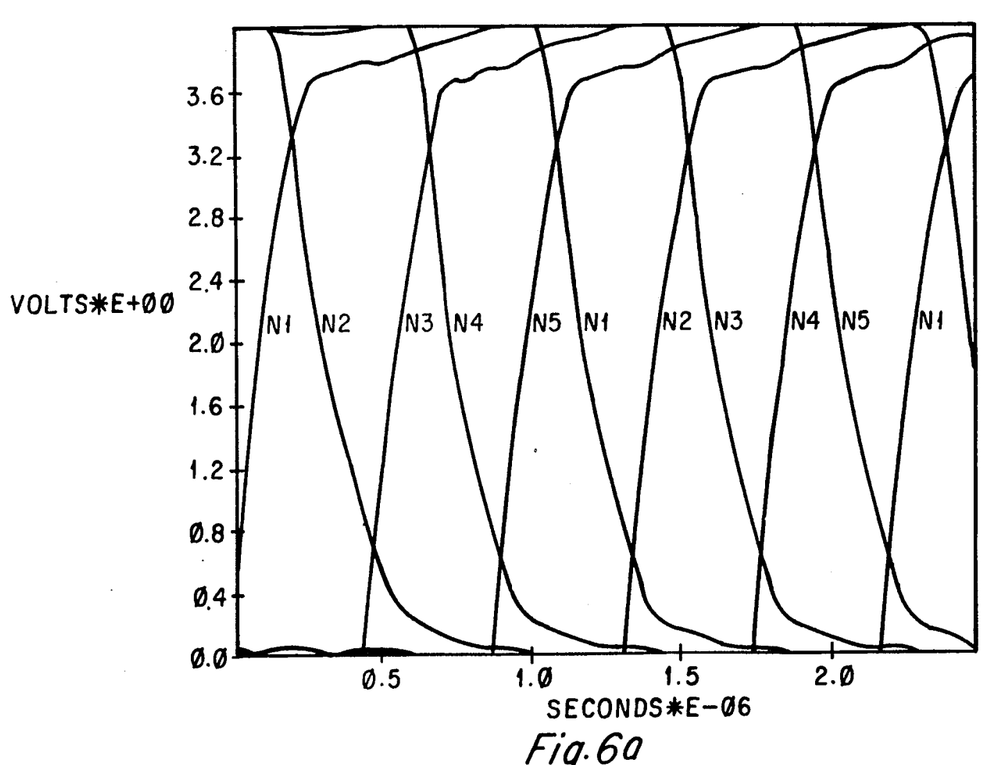
FIG. 6a is a diagram showing voltage waveforms at various nodes of the oscillator of FIG. 5 during low frequency operation.

FIG. 6a shows the voltage waveforms at nodes N1–N5 when the SELECT signal is low. Node N5 is initially low to turn transistors $50_5$ and $52_5$ on and transistors $53_5$ and $54_5$ off so that node N1 is charged only by current flowing from Vdd through transistors $50_5$ and $52_5$. The rising voltage at node N1 will eventually turn transistors $50_1$ and $52_1$ off and $53_1$ and $54_1$ on, permitting current to flow from node N2 to Vss discharging node N2. The falling voltage at node N2 will eventually turn transistors $50_2$ and $52_2$ on and $53_2$ and $54_2$ off, permitting current to flow from Vdd to node N3 charging node N3. The rising voltage at node N3 will eventually turn transistors $50_3$ and $52_3$ off and $53_3$ and $54_3$ on, permitting current to flow from node N4 to Vss discharging node N4. The falling voltage at node N4 will eventually turn transistors $50_4$ and $52_4$ on and $53_4$ and $54_4$ off, permitting current to flow from Vdd to node N5 charging node N5. As node N5 charges it will cause node N1 to discharge to complete one-half cycle.

Figure 6B:
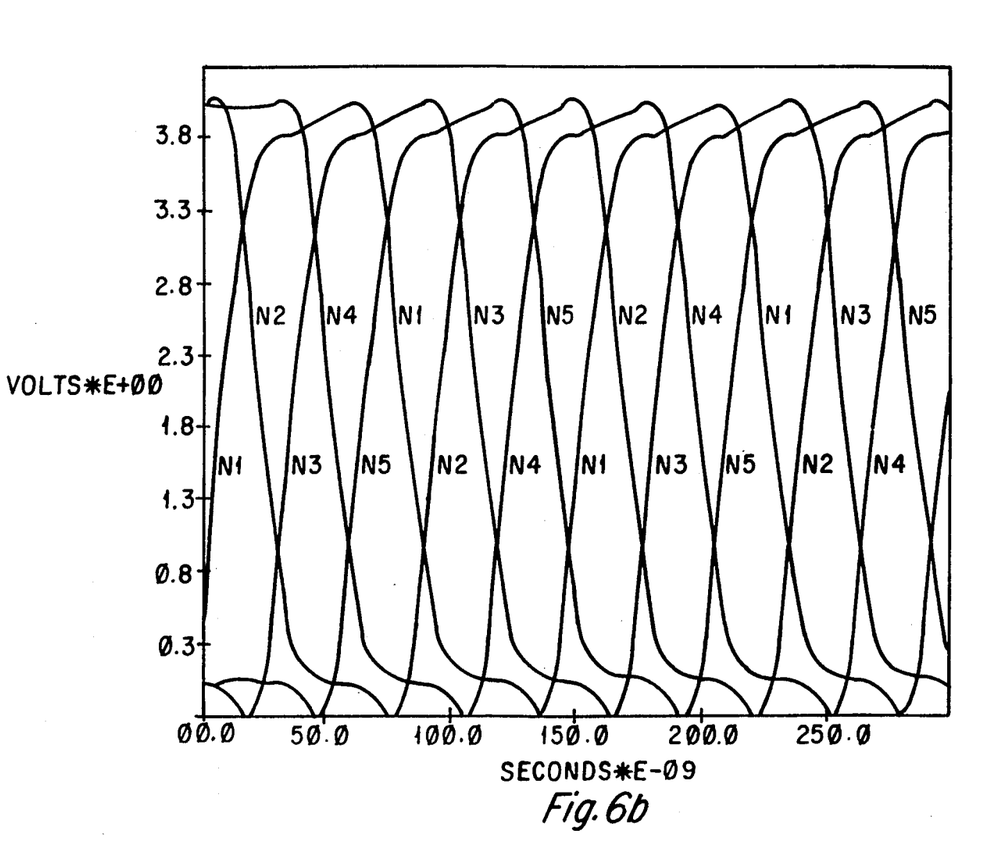
FIG. 6b is a diagram showing voltage waveforms at various nodes of the oscillator of FIG. 5 during high frequency operation.

FIG. 6b shows the voltage waveforms at nodes N1-N5 when the SELECT signal is high. Node N5 is initially low to turn transistors $50_5$ and $52_5$ on and transistors $53_5$ and $54_5$ off so that node N1 is charged by current flowing from Vdd through transistors $50_5$, $51_5$, and $52_5$. The rising voltage at node N1 will eventually turn transistors $50_1$ and $52_1$ off and $53_1$ and $54_1$ on, permitting current to flow from node N2 to Vss via transistors $53_1$, $54_1$, and $55_1$ discharging node N2. The falling voltage at node N2 will eventually turn transistors $50_2$ and $52_2$ on and $53_2$ and $54_2$ off, permitting current to flow from Vdd to node N3 via transistors $50_2$, $51_2$, and $52_2$ charging node N3. The rising voltage at node N3 will eventually turn transistors $50_3$ and $52_3$ off and $53_3$ and $54_3$ on, permitting current to flow from node N4 to Vss via transistors $53_3$, $54_3$, and $55_3$ discharging node N4. The falling voltage at node N4 will eventually turn transistors $50_4$ and $52_4$ on and $53_4$ and $54_4$ off, permitting current to flow from Vdd to node N5 via transistors $50_4$, $51_4$, and $52_4$ charging node N5. As node N5 charges it will cause node N1 to discharge to complete one-half cycle.

The current through each of transistors 50-55 in each of inverter stages $48_1$-$48_5$ is proportional to the width and length of the transistor. Accordingly, the sizes of transistors 50-55 in inverter stages are chosen to provide the desired low and high frequencies f1 and f2.

Although each of inverter stages $48_1$-$48_5$ is shown as having both transistors 51 and 55, it is understood that dual frequency operation results when only one of transistors 51 and 55 is used in one or more inverter stages.

Figure 7:
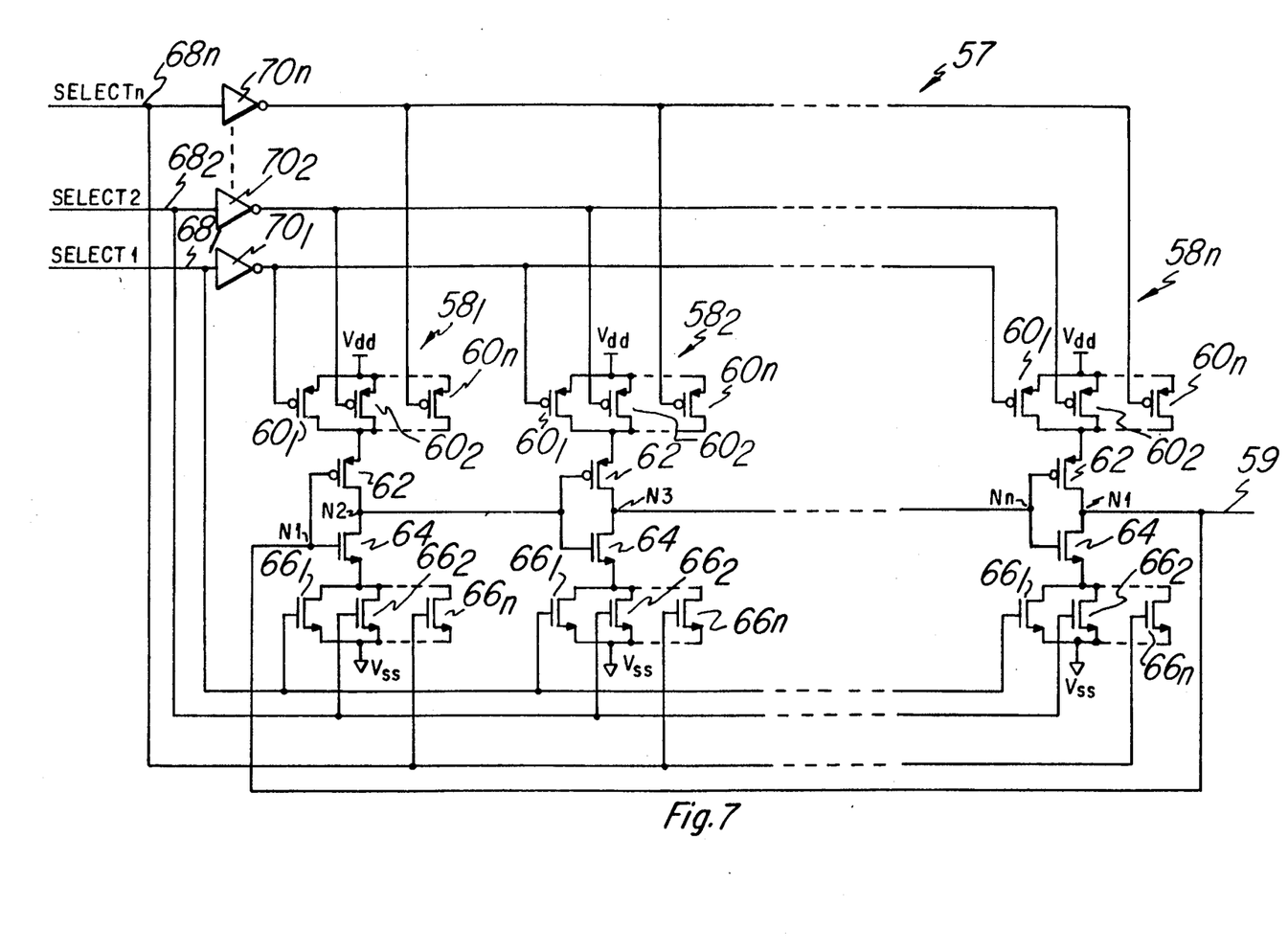
FIG. 7 is a schematic diagram of a multiple frequency oscillator.

FIG. 7 shows a multiple frequency oscillator 57 that provides an output signal having more than two selectable frequencies. Oscillator 57 may be used in substrate bias voltage generator 42 of FIG. 4 in place of dual frequency oscillator 44 whenever it is desired to drive charge pump 46 at more than two frequencies. Oscillator 57 is a ring oscillator having an odd number, n, where n is greater than or equal to 3, of cascaded inverter stages $58_1$-$58_n$. The outputs of inverter stages $58_1$, $58_2$-$58_n$ are connected to the inputs of stages $58_2$-$58_n$, and $58_1$, respectively.

Each inverter stage 58 includes parallel-coupled p-channel transistors $60_1$-$60_n$ having drains connected to a source of positive voltage Vdd and sources connected to the drain of p-channel transistor 62. Each inverter stage 58 also includes parallel coupled n-channel transistors $66_1$-$66_n$ having sources connected to Vss or ground and drains connected to the source of n-channel transistor 64. The input of each inverter stage 58 is connected to the gates of transistors 62 and 64. The output of each inverter stage 58 is connected between the source of transistor 62 and the drain of transistor 64.

The SELECT1 signal on line 68 is applied to the gates of n-channel transistors $66_1$ and to the input of inverter $70_1$. Inverter $70_1$ applies an inverted SELECT1 signal to the gates of p-channel transistors $60_1$. When the SELECT1 signal is low, transistors $66_1$ and $60_1$ are off. When the SELECT1 signal is high, transistors $66_1$ and $60_1$ are on.

The SELECT2 signal on line $68_2$ is applied to the gates of n-channel transistors $66_2$ and to the input of inverter $70_2$. Inverter $70_2$ applies an inverted SELECT2 signal to the gates of p-channel transistors $60_2$. When the SELECT2 signal is low, transistors $66_2$ and $60_2$ are off. When the SELECT2 signal is high, transistors $66_2$ and $60_2$ are on.

The SELECTn signal on line $68_n$ is applied to the gates of n-channel transistors $66_n$ and to the input of inverter $70_n$. Inverter $70_n$ applies an inverted SELECTn signal to the gates of p-channel transistors $60_n$. When the SELECTn signal is low, transistors $66_n$ and $60_n$ are off. When the SELECTn signal is high, transistors $66_n$ and $60_n$ are on.

The frequency of oscillation of the output signal on line 59 produced by oscillator 57 is determined by the rates at which nodes N1-Nn charge and discharge. Nodes N1-Nn charge and discharge in a manner similar to nodes N1-N5 of oscillator 44 of FIG. 4. The rate at which each of nodes N1-Nn charges and discharges is directly proportional to the capacitance at that node and the rate at which current flows to and from that node.

The states of the signals SELECT1-SELECTn control which of transistors $60_1$-$60_n$ and transistors $66_1$-$66_n$ are conductive or non-conductive to determine the rate at which current flows to or from nodes N1-Nn and thereby the frequency of the output signal produced by oscillator 57 on line 59. At least one of the signals SELECT1-SELECTn must be high during operation of oscillator 57 to provide at least one current path from Vdd to Vss in each of inverter stages $58_1$-$58_n$ to permit the charging and discharging of nodes N1-Nn. Increasing the number of SELECT signals that are high increases the rate at which current flows to and from nodes N1-Nn to increase the frequency of the output signal on line 59.

Each inverter stage of oscillator 57 could be provided with first and second additional transistors to eliminate the requirement that one of the SELECT1-SELECTn signals be high in order for oscillator 57 to operate. These first and second additional transistors would correspond to transistors 50 and 54 of FIG. 5. The first additional transistor would have a current path connected in parallel with the current paths of transistors $60_1$ and a gate connected to the gates of transistors 63 and 64. The second additional transistor would have a current path connected in parallel with the current paths of transistors $66_1$ and a gate connected to the gates of transistors 63 and 64.

A few preferred embodiments have been described in detail hereinabove. It is to be understood that the scope of the invention also comprehends embodiments different from those described, yet within the scope of the claims.

For example, bipolar transistors may be used in place of field effect transistors. In addition, implementation is contemplated in discrete components or fully integrated circuits in silicon, gallium arsenide, or other electronic materials families.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A multiple frequency oscillator, comprising:
a plurality of inverter stages, each inverter stage including an input and an output, the input of each inverter stage coupled to the output of at least one other inverter stage, one of said inverter stage outputs supplying an oscillator output signal;
at least one of said inverter stages having an input for receiving a control signal, said control signal selectively having a first state or a second state, said at least one inverter stage responsive to said first state to cause said oscillator output signal to have a first frequency and responsive to said second state to cause said oscillator output signal to have a second frequency different from said first frequency, said at least one inverter stage including a plurality of parallel current paths, at least one of said current paths being non-conductive in response to said first state of said control signal and conductive in response to said second state of said control signal.

2. The multiple frequency oscillator of claim 1, in which said at least one current path includes a transistor, said transistor being non-conductive in response to said first state of said control signal and conductive in response to said second state of said control signal.

3. The multiple frequency oscillator of claim 1, in which said at least one inverter stage includes:
first and second transistors having current paths connected in parallel;
a third transistor having a current path connected in series with the current paths of said first and second transistors between a first voltage source and the output of said at least one inverter stage;
a fourth transistor having a current path connected between said inverter stage output and a second voltage source;
the input of said at least one inverter stage coupled to control electrodes of said fourth transistor and at least one of said first and third transistors;
said second transistor having a control electrode for receiving said control signal, said second transistor being non-conductive in response to said control signal having said first state and conductive in response to said control signal having said second state.

4. A multiple frequency oscillator for use on an integrated circuit selectively operable in a standby mode or an active mode, comprising:
a plurality of inverter stages, each inverter stage including an input and an output, the input of each inverter stage coupled to the output of at least one other inverter stage, one of said inverter stage outputs supplying an oscillator output signal;
at least one of said inverter stages having an input for receiving a control signal, said control signal having a first stage in the standby mode or a second state in the active mode, said at least one inverter stage responsive to said first state to cause said oscillator output signal to have a first frequency and responsive to said second state to cause said oscillator output signal to have a second frequency different from said first frequency, said at least one inverter stage including a plurality of transistors having parallel current paths, at least one of said transistors being non-conductive in response to said first state of said control signal and conductive in response to said second state of said control signal.

5. A multiple frequency oscillator, comprising:
a plurality of inverter stages, each inverter stage including an input and an output, the input of each inverter stage coupled to the output of another inverter stage, one of said inverter stage outputs supplying an oscillator output signal;
at least one of said inverter stages including:
first and second transistors having current paths connected in parallel;
a third transistor having a current path connected in series with the current paths of said first and second transistors between a first voltage source and the output of said at least one inverter stage;
a fourth transistor having a current path connected between said inverter stage output and a second voltage source;
the input of said at least one inverter stage coupled to control electrodes of said fourth transistor and at least one of said first and third transistors;
said second transistor having a control electrode for receiving a first control signal having a first state and a second state, said second transistor being non-conductive in response to said first control signal having said first state and conductive in response to said first control signal having said second state.

6. The multiple frequency oscillator of claim 5, in which said first voltage source is a source of ground.

7. The multiple frequency oscillator of claim 5, in which said second voltage source is a source of positive voltage.

8. The multiple frequency oscillator of claim 5, in which there are 2n+1 inverter stages, where n is an integer greater than or equal to 1.

9. The multiple frequency oscillator of claim 5, in which the input of said at least one inverter stage is coupled to the control electrodes of said first and third transistors.

10. The multiple frequency oscillator of claim 5, in which the input of said at least one inverter stage is coupled to the control electrode of said third transistor, the control electrode of said first transistor receiving a second control signal having a first state and a second state, said first transistor being non-conductive in response to said second control signal having said first state and conductive in response to said second control signal having said second state.

11. The multiple frequency oscillator of claim 5, further including fifth and sixth transistors having current paths connected in parallel, said current path of said fourth transistor connected in series with the current paths of said fifth and sixth transistors between said second voltage source and said inverter stage output, said sixth transistor having a control electrode for receiving the complement of said first control signal, said sixth transistor being non-conductive in response to said first control signal having said first state and conductive in response to said first control signal having said second state.

12. The multiple frequency oscillator of claim 11, in which the input of said at least one inverter stage is coupled to control electrodes of said first, third, and fifth transistors.

13. The multiple frequency oscillator of claim 11, in which the input of said at least one inverter stage is coupled to the control electrode of said third transistor, the control electrode of said first transistor receiving a second control signal having a first state and a second state and a control electrode of said fifth transistor receiving the complement of said second control signal, said first and fifth transistors being non-conductive in response to said second control signal having said first state and conductive in response to said second control signal having said second state.

14. The multiple frequency oscillator of claim 13, further including:
   a seventh transistor having a current path coupled in parallel with the current paths of said first and second transistors and a control electrode for receiving a third control signal having a first state and a second state;
   an eighth transistor having a current path coupled in parallel with the current paths of said fifth and sixth transistors and a control electrode for receiving the complement of said third control signal, said seventh and eighth transistors being non-conductive in response to said third control signal having said first state and conductive in response to said third control signal having said second state.

15. The multiple frequency oscillator of claim 5, in which said first, second, third, and fourth transistors are field effect transistors.

16. The multiple frequency oscillator of claim 5, in which said first, second, and third transistors are of a first conductivity type and said fourth transistor is of a second conductivity type opposite said first conductivity type.

17. The multiple frequency oscillator of claim 16, in which said first, second, and third transistors are n-channel transistors and said fourth transistors is a p-channel transistor.

18. The multiple frequency oscillator of claim 5, in which said oscillator output signal has a first frequency when said first control signal has said first state and a second frequency when said first control signal has said second state, said first frequency being less than said second frequency.

19. A voltage generator for supplying a bias voltage to a node in an integrated circuit, comprising:
   a multiple frequency oscillator for producing an output signal having a frequency selected in response to at least one control signal; and
   a charge pump responsive to said output signal for supplying said bias voltage to said node;
   said multiple frequency oscillator including:
   a plurality of inverter stages, each inverter stage including an input and an output, the input of each inverter stage coupled to the output of at least one other inverter stage, one of said inverter stage outputs supplying said output signal;
   at least one of said inverter stages having an input for receiving said control signal, said control signal selectively having a first state or a second state, said at least one inverter stage responsive to said first state to cause said output signal to have a first frequency and responsive to said second state to cause said output signal to have a second frequency different from said first frequency, said at least one inverter stage including a plurality of parallel current paths, at least one of said current paths being non-conductive in response to said first state of said control signal and conductive in response to said second state of said control signal.

20. The voltage generator of claim 19, in which said control signal has said first state when said integrated circuit operates in a standby mode and said second state when said integrated circuit operates in a standby mode and said second state when said integrated circuit operates in an active mode.

21. The voltage generator of claim 19, in which said at least one current path includes a transistor, said transistor being non-conductive in response to said first state of said control signal and conductive in response to said second state of said control signal.

22. The voltage generator of claim 19, in which said at least one inverter stage includes:
   first and second transistors having current paths connected in parallel;
   a third transistor having a current path connected in series with the current paths of said first and second transistors between a first voltage source and the output of said at least one inverter stage;
   a fourth transistor having a current path connected between said inverter stage output and a second voltage source;
   the input of said at least one inverter stage coupled to control electrodes of said fourth transistor and at least one of said first and third transistors;
   said second transistor having a control electrode for receiving said control signal, said second transistor being non-conductive in response to said control signal having said first state and conductive in response to said control signal having said second state.

23. A multiple frequency oscillator, comprising:
   a plurality of inverter stages, each inverter stage including an input and an output, the input of each inverter stage coupled to the output of at least one other inverter stage, one of said inverter stage outputs supplying an oscillator output signal;
   at least one of said inverter stages having a frequency control circuit connected between a first voltage source and the output of said at least one inverter stage, said frequency control circuit receiving a first control signal selectively having a first state or a second state, said frequency control circuit having a first resistance in response to said first state to cause said oscillator output signal to have a first frequency and having a second resistance less than said first resistance in response to said second state to cause said oscillator output signal to have a second frequency greater than said first frequency:
   said at least one inverter stage including:
   a first transistor having a current path connected in parallel with said frequency control circuit;
   a second transistor having a current path connected in series with the current path of said first transistor between said first voltage source and the output of said at least one inverter stage;
   a third transistor having a current path connected between the output of said at least one inverter stage and a second voltage source;
   the input of said at least one inverter stage coupled to control electrodes of said third transistor and at least one of said first and second transistors.

24. The multiple frequency oscillator of claim 23, in which said frequency control circuit includes a fourth transistor having a current path connected in parallel with the current path of said first transistor and a control electrode for receiving said first control signal, said fourth transistor being non-conductive in response to said first control signal having said first state and conductive in response to said first control signal having said second state.

25. The multiple frequency oscillator of claim 23, in which the input of said at least one inverter stage is coupled to the control electrodes of said first and second transistors.

26. The multiple frequency oscillator of claim 23, in which the control electrode of said first transistor receives a second control signal selectively having a first state or a second state, said first transistor being non-conductive in response to said second control signal having said first state and conductive in response to said second control signal having said second state.

27. The multiple frequency oscillator of claim 23, in which said first voltage source is a source of ground.

28. The multiple frequency oscillator of claim 23, in which said first voltage source is a source of positive voltage.

29. A multiple frequency oscillator, comprising:
   a plurality of inverter stages, each inverter stage including an input and an output, the input of each inverter stage coupled to the output of at least one other inverter stage, one of said inverter stage outputs supplying an oscillator output signal;
   at least one of said inverter stages receiving a first control signal, said first control signal selectively having a first state or a second state, said at least one inverter stage responsive to said first state to cause said oscillator output signal to have a first frequency and responsive to said second state to cause said oscillator output signal to have a second frequency different from said first frequency, the input of said at least one inverter stage remaining at a substantially constant capacitance irrespective of the state of said first control signal, said at least one inverter stage including a frequency control circuit connected between a first voltage source and the output of said at least one inverter stage, said frequency control circuit receiving said first control signal, said frequency control circuit having a first resistance in response to said first state to cause said oscillator output signal to have a first frequency and having a second resistance less than said first resistance in response to said second state to cause said oscillator output signal to have a second frequency greater than said first frequency;
   said at least one inverter stage including:
   a first transistor having a current path connected in parallel with said frequency control circuit;
   a second transistor having a current path connected in series with the current path of said first transistor between said first voltage source and the output of said at least one inverter stage;
   a third transistor having a current path connected between the output of said at least one inverter stage and a second voltage source;
   the input of said at least one inverter stage coupled to control electrodes of said third transistor and at least one of said first and second transistors.

30. The multiple frequency oscillator of claim 29, in which said frequency control circuit includes a fourth transistor having a current path connected in parallel with the current path of said first transistor and a control electrode for receiving said first control signal, said fourth transistor being non-conductive in response to said first control signal having said first state and conductive in response to said first control signal having said second state.

31. The multiple frequency oscillator of claim 29, in which the input of said at least one inverter stage is coupled to the control electrodes of said first and second transistors.

32. The multiple frequency oscillator of claim 29, in which the control electrode of said first transistor receives a second control signal selectively having a first state or a second state, said first transistor being non-conductive in response to said second control signal having said first state and conductive in response to said second control signal having said second state.

33. The multiple frequency oscillator of claim 29, in which said first voltage source is a source of ground.

34. The multiple frequency oscillator of claim 29, in which said first voltage source is a source of positive voltage.

* * * * *